United States Patent
Jeon et al.

(10) Patent No.: US 7,719,049 B2
(45) Date of Patent: May 18, 2010

(54) FLASH MEMORY DEVICE AND FABRICATION METHOD THEREOF

(75) Inventors: Yoo Nam Jeon, Seongnam-si (KR); Ki Seog Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 82 days.

(21) Appl. No.: 11/957,830

(22) Filed: Dec. 17, 2007

(65) Prior Publication Data
US 2009/0067234 A1    Mar. 12, 2009

(30) Foreign Application Priority Data
Sep. 10, 2007    (KR) .................... 10-2007-0091520

(51) Int. Cl.
*H01L 29/788*    (2006.01)

(52) U.S. Cl. ............ 257/316; 257/E21.68; 365/185.01; 365/185.26; 438/257

(58) Field of Classification Search ............ 257/68–71, 257/296–309, 905–908, E27.084–E27.097, 257/E27.075, 314–326, E27.078, E29.3, 257/E29.309
See application file for complete search history.

(56) References Cited

U.S. PATENT DOCUMENTS

| 2006/0001081 | A1* | 1/2006 | Sasago et al. ............... 257/316 |
| 2006/0141710 | A1* | 6/2006 | Yoon et al. .................. 438/261 |
| 2006/0291281 | A1* | 12/2006 | Wang et al. ............ 365/185.05 |
| 2007/0166918 | A1* | 7/2007 | Oh et al. ..................... 438/257 |

FOREIGN PATENT DOCUMENTS

| JP | 08-172174 | 7/1996 |
| KP | 10-0708907 | 4/2007 |
| KR | 10-2006-0032860 | 4/2006 |
| KR | 10-2008-0015554 | 2/2008 |

* cited by examiner

*Primary Examiner*—Fernando L Toledo
*Assistant Examiner*—Mamadou Diallo
(74) *Attorney, Agent, or Firm*—Marshall, Gerstein & Borun LLP

(57) ABSTRACT

The present invention relates to a flash memory device and a fabrication method thereof. A trench may be formed within a junction region between word lines by etching a semiconductor substrate between not only a word line and a select line, but also between adjacent word lines. Accordingly, the occurrence of a program disturbance phenomenon can be prevented as the injection of hot carriers into a program-inhibited cell is minimized in a program operation.

16 Claims, 4 Drawing Sheets

FLASH MEMORY DEVICE AND FABRICATION METHOD THEREOF

CROSS-REFERENCES TO RELATED APPLICATIONS

Priority is claimed to Korean patent application number 10-2007-91520, filed on Sep. 10, 2007, the disclosure of which is incorporated by reference in its entirety.

FIELD OF THE INVENTION

The present invention relates to a flash memory device and a fabrication method thereof. More particularly, the present invention relates to a flash memory device that can prevent the change of the threshold voltage of a program-inhibited cell in a program operation and a fabrication method thereof.

BACKGROUND OF THE INVENTION

Flash memory devices are classified into NOR type and NAND type devices. The NAND flash memory device is advantageous in that it has a high level of integration compared to the NOR flash memory device. A memory cell array of the NAND flash memory device includes a plurality of memory cell blocks. The memory cell block is described in more detail below.

FIG. 1 is a circuit diagram illustrating a memory cell block of a NAND flash memory device.

Referring to FIG. 1, a memory cell block includes a plurality of cell strings ST. The cell strings are respectively connected to bit lines BL1 to BL3 (only three bit lines are shown).

Each cell string ST has a structure in which a drain select transistor DST, a plurality of memory cells C0-1, C1 to Cn (n is an integer), and a source select transistor SST are connected in series. The drain select transistor DST included in each cell string has a drain connected to a corresponding bit line BL1, and the source select transistor SST has a source connected to a common source line CSL. The gates of the drain select transistors DST included in the respective cell strings are interconnected and become a drain select line DSL. Similarly, the gates of the source select transistors SST included in the respective cell strings are interconnected and become a source select line SSL. Further, the gates of the memory cells are interconnected and thus become word lines WL0-WLn. The memory cells C0-1, C0-2, and C0-3 sharing one word line (for example, WL0) are defined as one page Page0.

A program operation is performed in order to store data in the flash memory cell. The program operation is performed on per page basis. In the program operation, a program voltage of 15V or more is applied to a selected word line (for example, WL0), and a pass voltage is applied to the remaining word lines so that the memory cell is turned on irrespective of an erase state or a program state. A ground voltage of 0V is applied to the bit lines.

During the program operation, there exist memory cells in which an erase state (or a previous state) must be kept (hereinafter, referred to as "program-inhibited cells"). A program-inhibited voltage (for example, Vcc) is applied to the bit line BL2 connected to the string ST, including a program-inhibited cell (for example, Cb) in which a previous state must be kept without being programmed. If a program voltage is applied to the word line WLk after the channel region of the program-inhibited cell Cb is precharged to the program-inhibited voltage, the voltage of the channel region rises due to channel boosting. Accordingly, a program operation is not performed because a voltage difference between the channel region of the program-inhibited cell Cb and the word line WLk is low.

A program method of storing 2-bit data in one memory cell has recently been used. An erase operation of a memory cell block is performed anterior to a program operation, so that the entire memory cells become an erase state. Thus, the memory cells generally have 11 data stored therein. The program method for storing 2-bit data is performed by several program operations. Each program operation includes a LSB program operation of changing lower bits of the 2-bit data comprised of 11 data into 0 and a MSB program operation of changing upper bits thereof into 0.

In general, after the LSB program operation and the MSB program operation are sequentially performed on a selected word line, they are performed on a next word line adjacent to the selected word line. However, due to an interference phenomenon occurring between memory cells in the program operation, the threshold voltage of a memory cell connected to the selected word line and the adjacent word line may be changed during the program operation of the selected word line. In order to minimize such change, the order of the LSB program operation and the MSB program operation may be changed.

FIG. 2 is a sectional view illustrating the occurrence of a disturbance phenomenon due to hot carriers in a program operation of a memory cell.

Referring to FIGS. 1 and 2, when the order of the LSB program operation and the MSB program operation is changed, memory cells Ca and Cc sharing word lines WLk−1 and WLk+1 near a selected word line WLk have already become a LSB state (a state where the LSB program operation has been performed) or a MSB state (a state where the MSB program operation has been performed) in a program operation of a memory cell Cb. Thus, in the program operation of the memory cell Cb, the neighboring memory cells Ca and Cc are turned off. Due to this, the channel region of the memory cell Cb is isolated from the channel regions of the memory cells Ca and Cc.

In this state, if a program operation of the memory cell Cb is performed by applying a high program voltage Vpgm to the word line WLk, a boosting phenomenon occurs in a channel region 202a of the memory cell Cb, so a voltage of the channel region 202a rises. As the voltage of the channel region 202a rises, a voltage difference between the word line WLk and the channel region 202a of the memory cell Cb is lowered, so that the memory cell Cb is not programmed.

However, if the program voltage Vpgm is applied, hot carriers are generated at the corners of junction regions 202b and 202c adjacent to the neighboring word lines WLk−1 and WLk+1. The hot carriers are injected into a floating gate of the memory cell Cb due to the high program voltage. Consequently, the threshold voltage of the memory cell Cb that should not be programmed rises and a program disturbance phenomenon of the memory cell Cb occurs.

BRIEF SUMMARY OF THE INVENTION

Various embodiments of the present invention are directed to preventing the occurrence of a program disturbance phenomenon by minimizing the injection of hot carriers into a program-inhibited cell in a program operation. In various embodiments of the present invention, a trench may be formed within a junction region between word lines by etching a semiconductor substrate between not only a word line and a select line, but also between adjacent word lines.

A flash memory device according to an embodiment of the present invention may include a plurality of select lines and word lines formed over a semiconductor substrate, a first junction region formed on the semiconductor substrate between adjacent word lines, and a first trench formed in the first junction region.

In an embodiment of the present invention, the first trench may have a depth that is shallower than that of the first junction region.

In an embodiment of the present invention, the flash memory device may further include, a second junction region formed on the semiconductor substrate between adjacent select lines, a third junction region formed on the semiconductor substrate between the select lines and the word lines, and second and third trenches respectively formed in the second and third junction regions. The second trench may have a depth that is shallower than that of the second junction region. The third trench may have a depth that is shallower than that of the third junction region.

A flash memory device according to another embodiment of the present invention may include a plurality of select lines and word lines formed over a semiconductor substrate, a first junction region formed on the semiconductor substrate between adjacent word lines, wherein a center of the first junction region may be formed in a concave ⌴shape.

In an embodiment of the present invention, the flash memory device may further include, a second junction region formed over the semiconductor substrate between adjacent select lines, wherein a center of the second junction region may be formed in a concave ⌴shape, and a third junction region formed over the semiconductor substrate between the select line and the word line, wherein a center of the third junction region may be formed in a concave ⌴shape.

In an embodiment of the present invention, the first junction region may have edges overlapped with those of the word line.

In an embodiment of the present invention, a distance between a word line adjacent to a select line and the select line may be wider than that between adjacent word lines.

In an embodiment of the present invention, one or more of the word line and the select line may have a stack structure. The stack structure may comprise a tunnel insulating film, a charge storage layer, a dielectric layer, and a control gate. The charge storage layer may be, for example, a nitride layer. The dielectric layer may be, for example, an aluminum oxide layer.

A method of fabricating a flash memory device according to still another embodiment of the present invention may include, forming a plurality of word lines and select lines over a semiconductor substrate, forming junction regions on the semiconductor substrate between the select lines and the word lines, adjacent select lines, and adjacent word lines, and forming trenches in the junction regions between adjacent word lines.

In an embodiment of the present invention, the trenches may also be formed in the junction region between the select line and the word line, and the junction region between the select lines. The trench may have a depth that is shallower than that of the junction region.

In an embodiment of the present invention, the method may further include, performing an ion implantation process in order to additionally implant an impurity into the junction regions after the trenches are formed. The method may further include, forming an insulating film along one or more surfaces of the junction regions, the select lines, and the word lines before the ion implantation process is performed.

In an embodiment of the present invention, one or more of the word lines and the select lines may have a stack structure that may include a tunnel insulating film, a charge storage layer, a dielectric layer and a control gate. The charge storage layer may be, for example, a nitride layer. The charge storage layer may be, for example, a polysilicon layer. The dielectric layer may be, for example, an aluminum oxide layer.

In an embodiment of the present invention, a trench may be formed within a junction region between adjacent word lines. Accordingly, the injection of hot carriers into a program-inhibited cell in a program operation can be minimized and, therefore, the occurrence of a program disturbance phenomenon can be prevented. Furthermore, a rise of the threshold voltage of a program-inhibited cell can be prevented, so malfunction can be prevented.

DESCRIPTION OF SPECIFIC EMBODIMENTS

Several embodiments of the present invention will be described with reference to the accompanying drawings. These embodiments are used only for illustrative purpose, the invention is not limited thereto.

Figure 1:
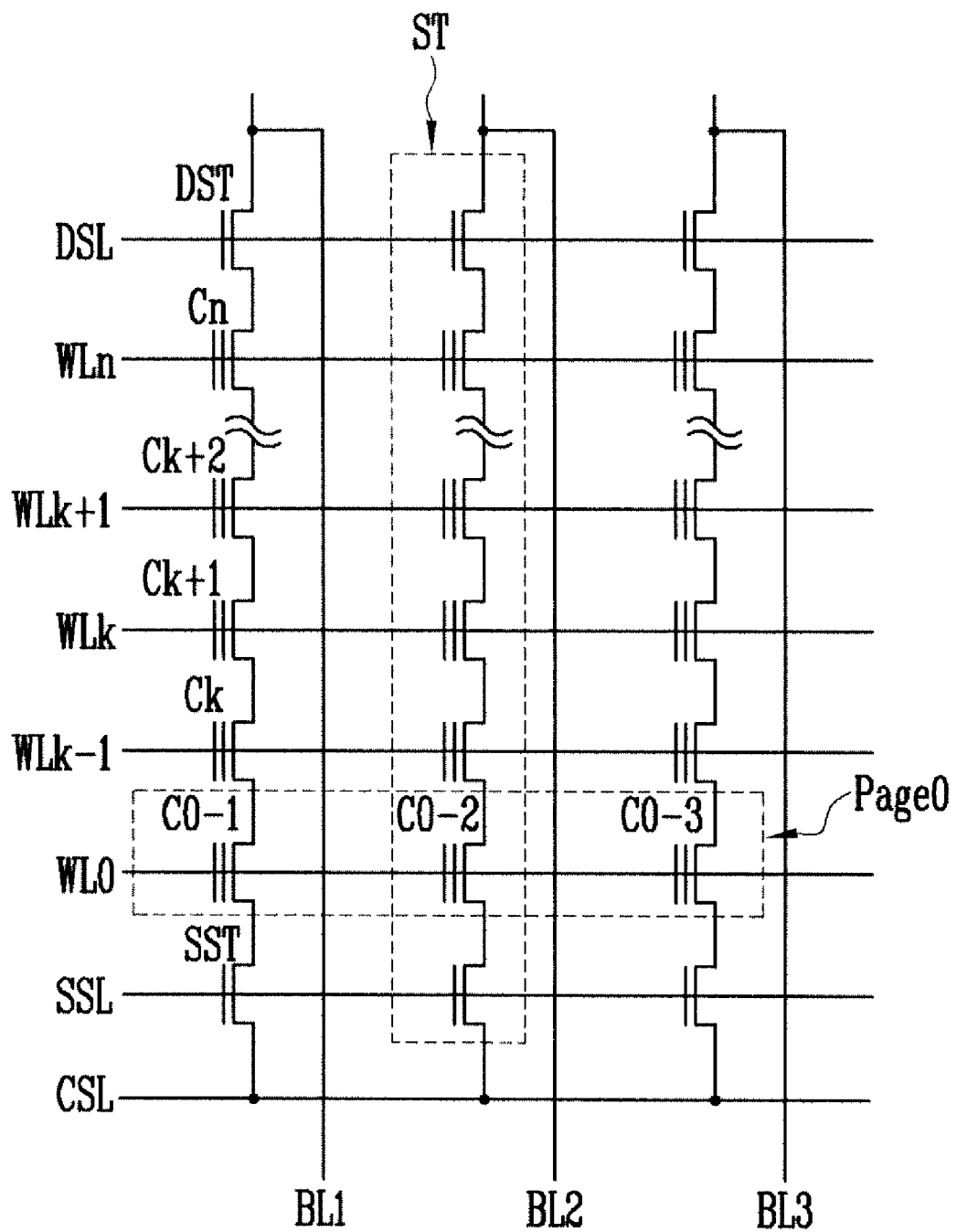
FIG. 1 is a circuit diagram illustrating a memory cell block of a NAND flash memory device.
Figure 2:
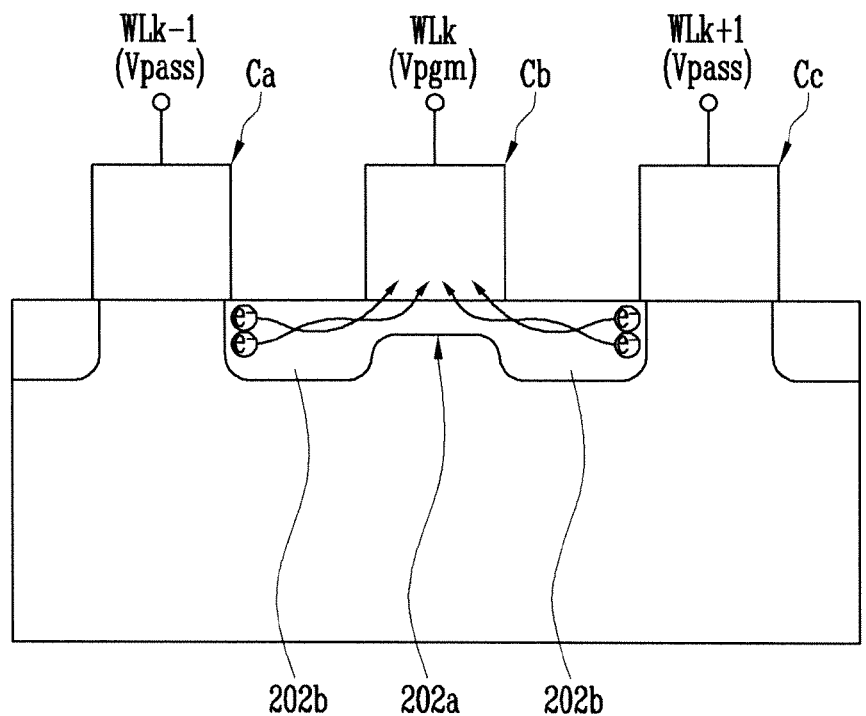
FIG. 2 is a sectional view illustrating the occurrence of a disturbance phenomenon due to hot carriers in a program operation of a memory cell.
Figure 3A:
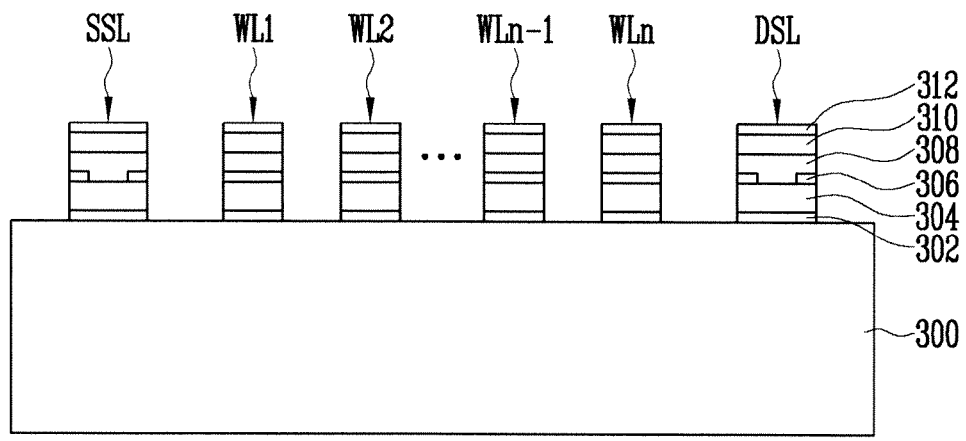
FIGS. 3A to 3D are sectional views illustrating a method of fabricating a flash memory device according to an embodiment of the present invention.

Referring to FIG. 3A, an N well (not shown) may be formed in a semiconductor substrate 300 and a P well (not shown) may be formed within the N well. Isolation layers (not shown) may be formed in the semiconductor substrate 300. The isolation layers may be formed both in a cell region and a peri region. In the cell region, several isolation layers may be formed in parallel. The semiconductor substrate 300 between the isolation layers may be defined as an active region where a memory cell may be formed. The isolation layer can be formed using, for example, a Self-Aligned Shallow Trench Isolation (SA-STI) method.

A plurality of select lines SSL and DSL and word lines WL0 to WLn crossing the isolation layers may be formed over the semiconductor substrate 300. The select lines SSL and DSL and the word lines WL0 to WLn may have a stack structure. The stack structure may include, for example, a tunnel insulating film 302, a charge storage layer 304, a dielectric layer 306, control gates 308 and 310, and a hard mask 312. The charge storage layer 304 may be, for example, a polysilicon layer. The control gates 308 and 310 may have a stack structure of, for example, a polysilicon layer and a metal layer (or a metal silicide layer). The dielectric layer 306 may be, for example, an Oxide/Nitride/Oxide (ONO) layer or an insulating film including a high-k layer. In a memory cell of a SONOS (Silicon-Oxide-Nitride-Oxide-Silicon) or MANOS (Metal-Aluminum oxide-Nitride-Oxide-Silicon) structure, the charge storage layer 304 may be, for example, a nitride layer and the dielectric layer 306 may be, for example, an aluminum oxide layer.

The select lines may include the drain select line DSL and the source select line SSL. In the select lines DSL and SSL, holes may be formed in the dielectric layer 306, so that the charge storage layer 304 and the control gates 308 and 310 are electrically connected. However, in the memory cell of the SONOS or MANOS structure, the holes may not be formed in the dielectric layer 306.

A distance between the select line SSL or DSL and the word line WL0 or WLn adjacent to the select line may be wider than a distance between adjacent word lines WL0 to WLn.

Figure 3B:
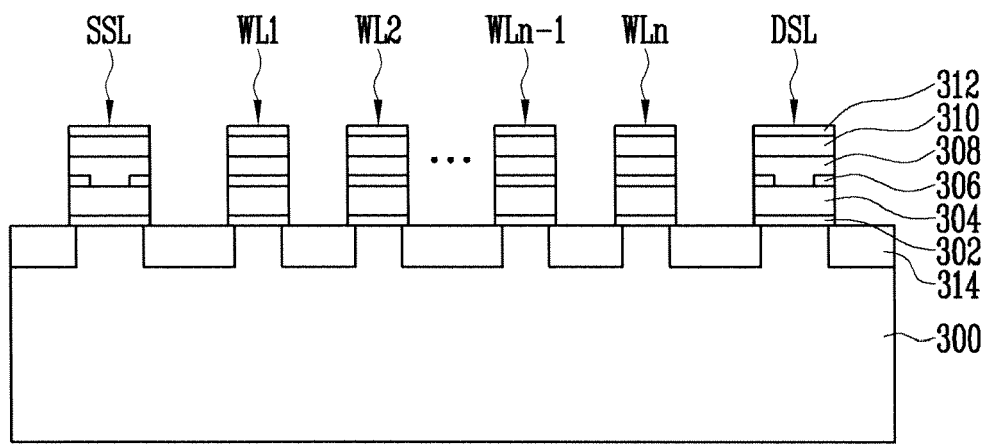

Referring to FIG. 3B, junction regions 314 may be formed in the semiconductor substrate 300. The junction regions 314 may be exposed between the select lines SSL and the word lines WL0 to WLn by performing a first ion implantation process. The junction regions 314 may be formed, for example, by injecting an N type impurity. The junction region 314 may have one or more edges overlapped with one or more edges of the select lines DSL and SSL or the word lines WL0 to WLn. To achieve this overlap, the N type impurity may, for example, be injected inclinedly, or, after the N type impurity is injected, the N type impurity may be diffused in a horizontal direction. The N type impurity may, for example, be diffused using an annealing process.

A junction region 314 may be formed between the drain select lines DSL and may become a drain connected to a bit line that may be formed in a subsequent process. A junction region 314 may be formed between the source select lines SSL and may become the source connected to a common source line that may be formed in a subsequent process.

Figure 3C:
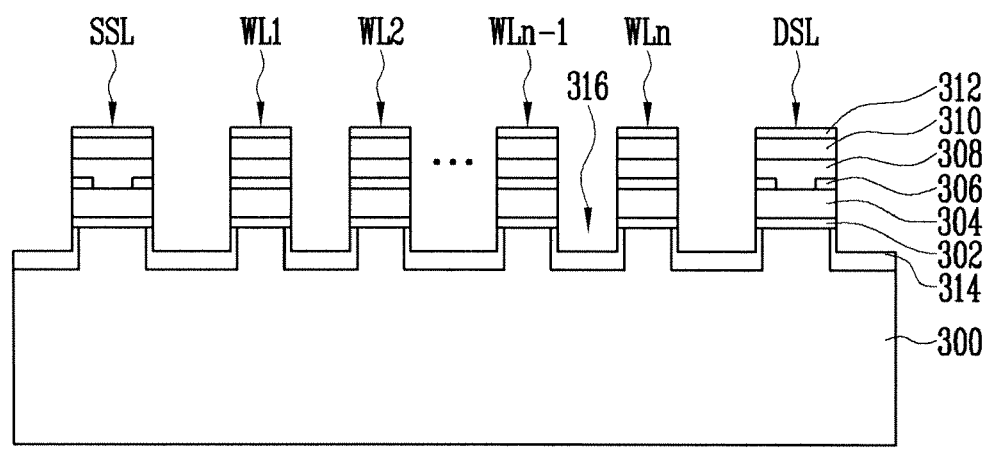

Referring to FIG. 3C, trenches 316 may be formed by etching the semiconductor substrate 300 between the select lines DSL and SSL and the word lines WL0 to WLn. In the etch process for forming the trenches 316, the select lines DSL and SSL and the word lines WL0 to WLn may be protected by a hard mask 312. The trench 316 may have a depth shallower than that of the junction region 314. If the trench 316 is formed shallower than the junction region 314, it is surrounded by the junction region 314.

If the junction region 314 is formed after the trench 316 is formed, a cell current may decrease abruptly since the overlapping width of the junction region 314 and the select lines DSL and SSL and the word lines WL0 to WLn cannot be secured sufficiently. For this reason, the junction region 314 may be formed before the trench 316 is formed.

Figure 3D:
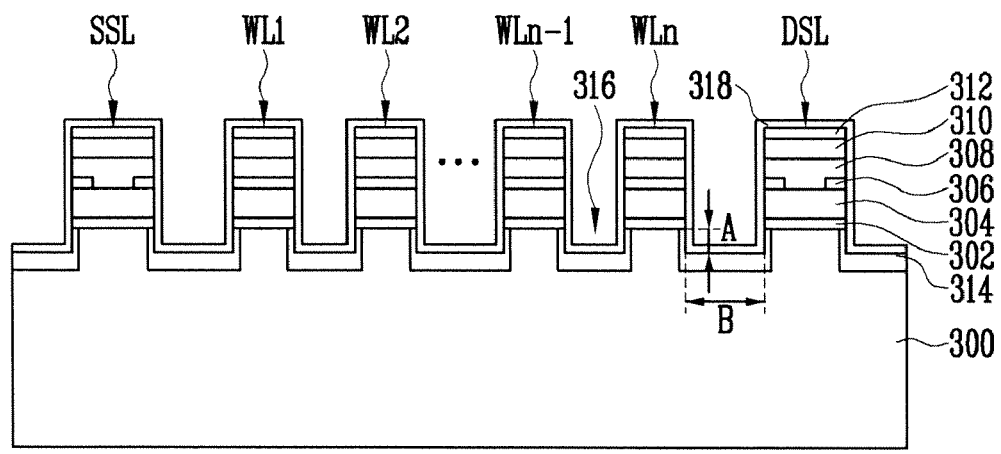

Referring to FIG. 3D, an insulating film 318 may be formed on one or more sidewalls of the trenches 316 and surfaces of the select lines DSL and SSL and the word lines WL0 to WLn. The insulating film 318 functions to protect the surface of the substrate 300 in a subsequent ion implantation process and also make the junction region 314 have a Lightly Doped Drain (LDD) structure. The insulating film 318 may be, for example, an oxide layer.

In order to compensate for a reduction in an impurity concentration of the junction region 314, which occurs when the trenches 316 are formed, a second ion implantation process may be carried out. In the second ion implantation process, an N type impurity, for example, may be implanted. The N type impurity may have a concentration higher than that of an impurity in the first ion implantation process. The impurity of a high concentration may be concentrically implanted into the bottom according an ion implantation angle.

When the trench 316 is formed in the junction region 314 as described above, the length of the junction region 314 between adjacent word lines (for example, WLn−1 and WLn) increases to A+B+A. By forming the junction region 314 of a Ushape between adjacent word lines using the trench 316, the migration path of electrons generated by Gate Induced Drain Leakage (GIDL) occurring in adjacent cells is lengthened and an electric field is decreased. Accordingly, the movement of hot carriers becomes difficult and, therefore, program disturbance due to the hot carriers can be prevented.

Although the foregoing description has been made with reference to specific embodiments, it is to be understood that changes and modifications of the present invention may be made by one of ordinary skill in the art without departing from the spirit and scope of the present invention and appended claims.

What is claimed is:

1. A flash memory device, comprising:
a plurality of select lines and word lines formed over a semiconductor substrate;
a first junction region formed on the semiconductor substrate between adjacent word lines;
a first trench formed in the first junction region;
a second junction region formed on the semiconductor substrate between the select lines and the word lines; and
a second trench formed in the second junction region.

2. The flash memory device of claim 1, wherein the first trench has a depth shallower than a depth of the first junction region.

3. The flash memory device of claim 1, further comprising:
a third junction region formed on the semiconductor substrate between adjacent select lines; and
a third trench formed in the third junction region.

4. The flash memory device of claim 3, wherein:
the second trench has a depth shallower than a depth of the second junction region, and
the third trench has a depth shallower than a depth of the third junction region.

5. The flash memory device of claim 1, wherein the first junction region has one or more edges overlapped with one or more edges of the word lines.

6. The flash memory device of claim 1, wherein a distance between a word line adjacent to a select line and the select line is wider than a distance between adjacent word lines.

7. The flash memory device of claim 1, wherein one or more of the word lines and the select lines have a stack structure that comprises a tunnel insulating film, a charge storage layer, a dielectric layer, and a control gate, and wherein the charge storage layer comprises a nitride layer.

8. The flash memory device of claim 7, wherein the dielectric layer comprises an aluminum oxide layer.

9. The flash memory device of claim 1, wherein one or more of the word lines or the select lines have a stack structure that comprises a tunnel insulating film, a charge storage layer, a dielectric layer and a control gate, and wherein the charge storage layer comprises a polysilicon layer.

10. A flash memory device, comprising:
a plurality of select lines and word lines formed over a semiconductor substrate;
a first junction region formed on the semiconductor substrate between adjacent word lines; and
a second junction region formed over the semiconductor substrate between the select lines and the word lines,
wherein centers of the first and second junction regions have a concave shape.

11. The flash memory device of claim 10, further comprising:
a third junction region formed over the semiconductor substrate between adjacent select lines, wherein a center of the third junction region has a concave shape.

12. The flash memory device of claim 10, wherein the first junction region has one or more edges overlapped with one or more edges of the word lines.

13. The flash memory device of claim 10, wherein a distance between a word line adjacent to a select line and the select line is wider than a distance between adjacent word lines.

14. The flash memory device of claim 10, wherein one or more of the word lines and the select lines have a stack structure that comprises, a tunnel insulating film, a charge storage layer, a dielectric layer, and a control gate, and wherein the charge storage layer comprises a nitride layer.

15. The flash memory device of claim 14, wherein the dielectric layer comprises an aluminum oxide layer.

16. The flash memory device of claim 10, wherein one or more of the word lines or the select lines have a stack structure that comprises a tunnel insulating film, a charge storage layer, a dielectric layer and a control gate, and wherein the charge storage layer comprises a polysilicon layer.

* * * * *